United States Patent
Nowak

(10) Patent No.: US 7,177,619 B2
(45) Date of Patent: Feb. 13, 2007

(54) DUAL GATE FINFET RADIO FREQUENCY SWITCH AND MIXER

(75) Inventor: Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 100 days.

(21) Appl. No.: 10/905,874

(22) Filed: Jan. 25, 2005

(65) Prior Publication Data

US 2006/0164180 A1 Jul. 27, 2006

(51) Int. Cl.
*H04B 1/26* (2006.01)
*H01P 1/10* (2006.01)
*H01L 21/336* (2006.01)

(52) U.S. Cl. .................. 455/332; 455/326; 455/333; 333/101

(58) Field of Classification Search ............... 455/332, 455/326, 327, 333–334, 319–320, 323–325, 455/313, 131, 136, 293; 333/101–104; 340/829.91–825.96; 257/724
See application file for complete search history.

(56) References Cited

U.S. PATENT DOCUMENTS

| | | | |
|---|---|---|---|
| 4,162,451 A * | 7/1979 | Ash | 455/333 |
| 4,408,347 A * | 10/1983 | Ash | 455/179.1 |
| 5,150,083 A | 9/1992 | Chen et al. | |
| 5,696,470 A * | 12/1997 | Gupta et al. | 333/103 |
| 5,777,530 A * | 7/1998 | Nakatuka | 333/104 |
| 5,990,580 A | 11/1999 | Weigand | |
| 6,346,744 B1 * | 2/2002 | Geller | 257/724 |
| 6,496,082 B1 * | 12/2002 | DiPiazza | 333/101 |
| 6,900,711 B2 * | 5/2005 | Vice | 333/262 |
| 6,933,802 B2 * | 8/2005 | Kushitani et al. | 333/103 |
| 7,026,858 B2 * | 4/2006 | Tosaka | 327/427 |
| 7,068,123 B2 * | 6/2006 | Cayrou et al. | 333/103 |
| 2003/0119473 A1 | 6/2003 | Smith et al. | |

FOREIGN PATENT DOCUMENTS

| | | |
|---|---|---|
| DE | 2656437 A1 | 6/1978 |
| DE | 142115 A | 6/1980 |
| DE | 3242547 A1 | 5/1984 |
| JP | 62104074 A | 5/1987 |

* cited by examiner

*Primary Examiner*—Pablo N. Tran
(74) *Attorney, Agent, or Firm*—Gibb I.P. Law Firm, LLC; William D. Sabo, Esq.

(57) ABSTRACT

A method modifies dual gate transistor into a radio frequency switch. The method attaches a first signal input to a first gate of the transistor, attaches a second signal input to the source or drain of the transistor, attaches a common gate contact to the first gate and the second gate, attaches a signal output to a second gate of the transistor, attaches a source/drain contact connected to the source region or drain region where the second signal input is attached, and modulates the voltage supplied to the common gate and the source/drain contact to control the radio frequency switch.

33 Claims, 3 Drawing Sheets

DUAL GATE FINFET RADIO FREQUENCY SWITCH AND MIXER

BACKGROUND OF THE INVENTION

1. Field of the Invention

This invention is directed to a semiconductor structure that includes a dual gate structure for use as a radio frequency mixer and switch.

2. Description of the Related Art

A means of switching radio frequency (rf) energy is important for on-chip radio applications. Desired characteristics of a radio frequency switch include low loss, high isolation, large dynamic range, and low distortion. As transistor design is improved and evolves, the number of different types of transistors continues to increase. For example, one type of transistor that uses a fin-shaped channel region covered with a gate conductor, with the outer portions of the fin being used as source/drain regions, is referred to as a fin-type field effect transistor (FinFET). One such FinFET is disclosed in U.S. Pat. No. 6,413,802 to Hu et al. (hereinafter "Hu") and the disclosure of the same is incorporated herein by reference. A dual gate version of a FinFET device is disclosed in US patent publication number 20030111686, which is incorporated herein by reference. Another type of transistor that has been developed recently is a dual gate metal oxide semiconductor (MOS) transistor such as that disclosed in US patent publication number 20040235283, which is also incorporated herein by reference. It would be advantageous to utilize this evolving transistor technology in the field of radio frequency devices, and the invention described below is directed to such advantages.

SUMMARY OF THE INVENTION

The invention presents dual gate transistor structures that are modified as radio frequency mixers and switches. These transistor structures can comprise any type of transistor, such as fin-type field effect transistors (FinFETs) as well as metal oxide semiconductor (MOS) dual gate transistors.

The FinFET embodiments have a fin having a source region at one end of the fin, a drain region at an opposite end of the fin, and a channel region in a center of the fin. The MOS embodiments have a channel region between source and drain regions. In both type of embodiments, the invention includes a first gate on a first side of the channel region and a second gate on a second side of the channel region, opposite the first side. A common gate contact is also attached to the first gate and the second gate. Alternatively, separate gate contacts may be used to modify the transistor's operation. A first signal input is attached to the first gate and a second signal input is attached to either the source or drain regions. Also, a source/drain contact is connected to the source or drain region where the signal input is attached. Alternatively, the structure may comprise only a single source or a single drain, which is then connected to the second input signal. A signal output is attached to the second gate. Typically, the first signal input and the signal output comprise radio-frequency signals, and the second signal input may comprise a switching voltage, or, a second radio-frequency input, when the apparatus is to be used as a radio-frequency mixer.

A method embodiment of the invention modifies any dual gate transistor into a radio frequency switch. The method attaches a first signal input to a first gate of the transistor, attaches a second signal input to the source or drain of the transistor, attaches a common gate contact to the first gate and the second gate, attaches a signal output to a second gate of the transistor, attaches a source/drain contact to the source region or drain region where the second signal input is attached, and modulates the voltage supplied to the common gate and the source/drain contact to control the radio frequency switch.

The signal output produces a combined signal resulting from a combination of different input signals received by the first signal input and the second signal input. When the common gate contact controls voltage of the first gate and the second gate to be less than a threshold voltage of the channel region added to a voltage of the source/drain contact, the radio frequency switch is on. When the common gate contact controls voltage of the first gate and the second gate to be greater than a threshold voltage of the channel region added to a voltage of the source/drain contact, the radio frequency switch is off. When the radio frequency switch is off, the radio frequency switch does not pass signals from the first input to the signal output, and when the radio frequency switch is on, the radio frequency switch passes radio frequency signals from the first signal to the signal output. When the second signal input is time-varying, e.g. a radio-frequency signal, the output signal will comprise the product of the first signal input and the second signal input, thereby 'mixing' the two signal inputs.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED

Embodiments of the Invention

Figure 1:
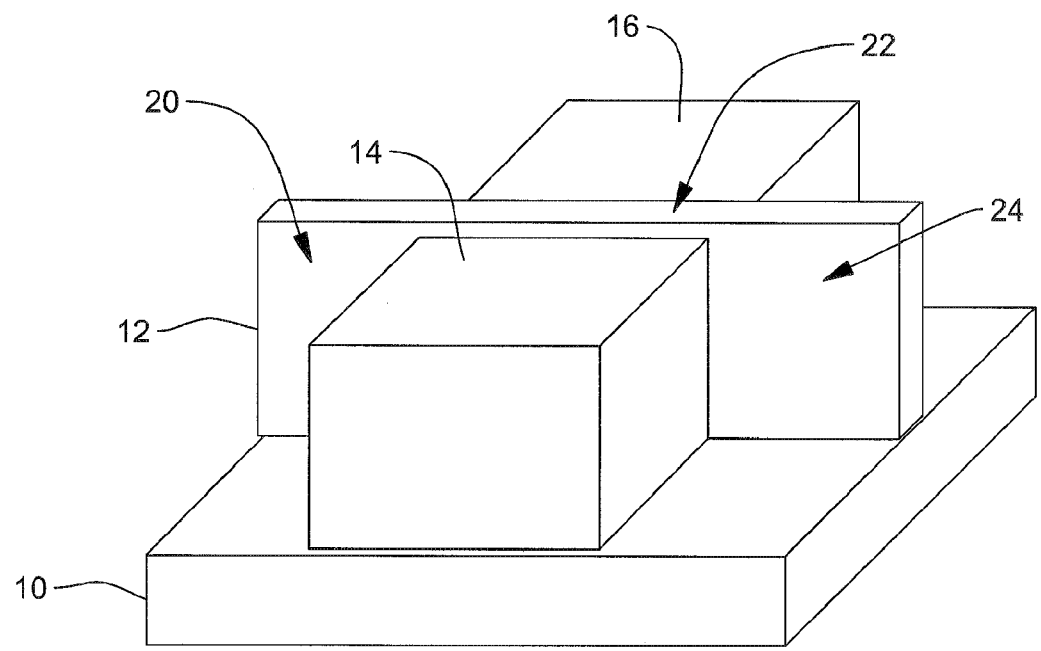
FIG. 1 is a schematic diagram of a dual gate FinFET.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

The invention presents dual gate transistor structures that are modified as radio frequency mixers and switches. These transistor structures can comprise any type of transistor and two non-limiting examples including a fin-type field effect transistor (FinFET) and a metal oxide semiconductor (MOS) dual gate transistor are described herein to illustrate the invention. While two types of transistors are used as examples herein, one ordinarily skilled in the art would understand that the invention is applicable to any type of appropriate transistor and the invention is not limited only to the two types of transistors discuss herein.

Figure 2:
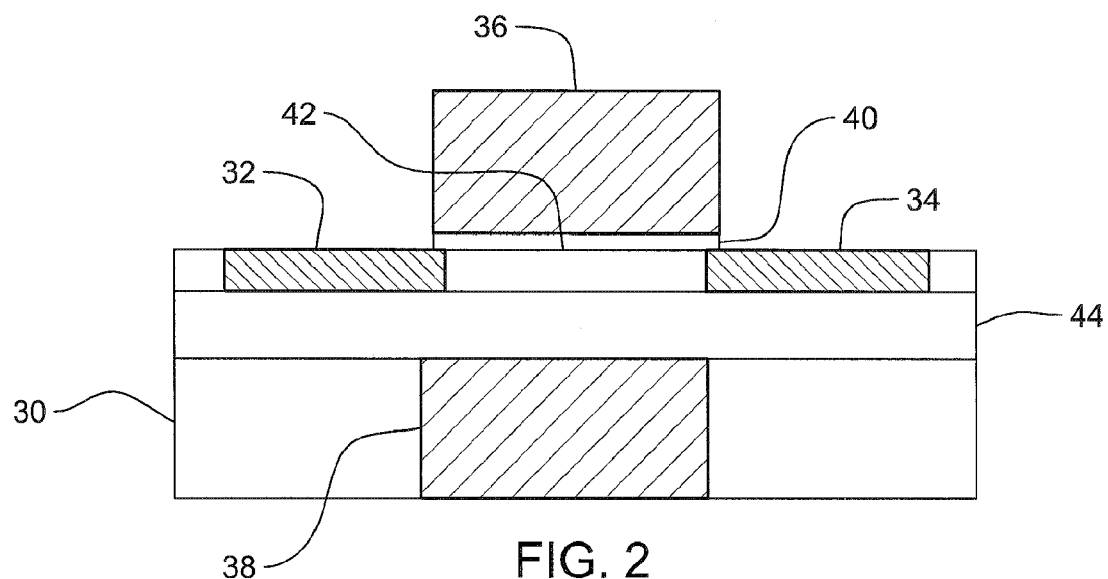
FIG. 2 is a schematic diagram of a dual gate MOS transistor.
Figure 3:
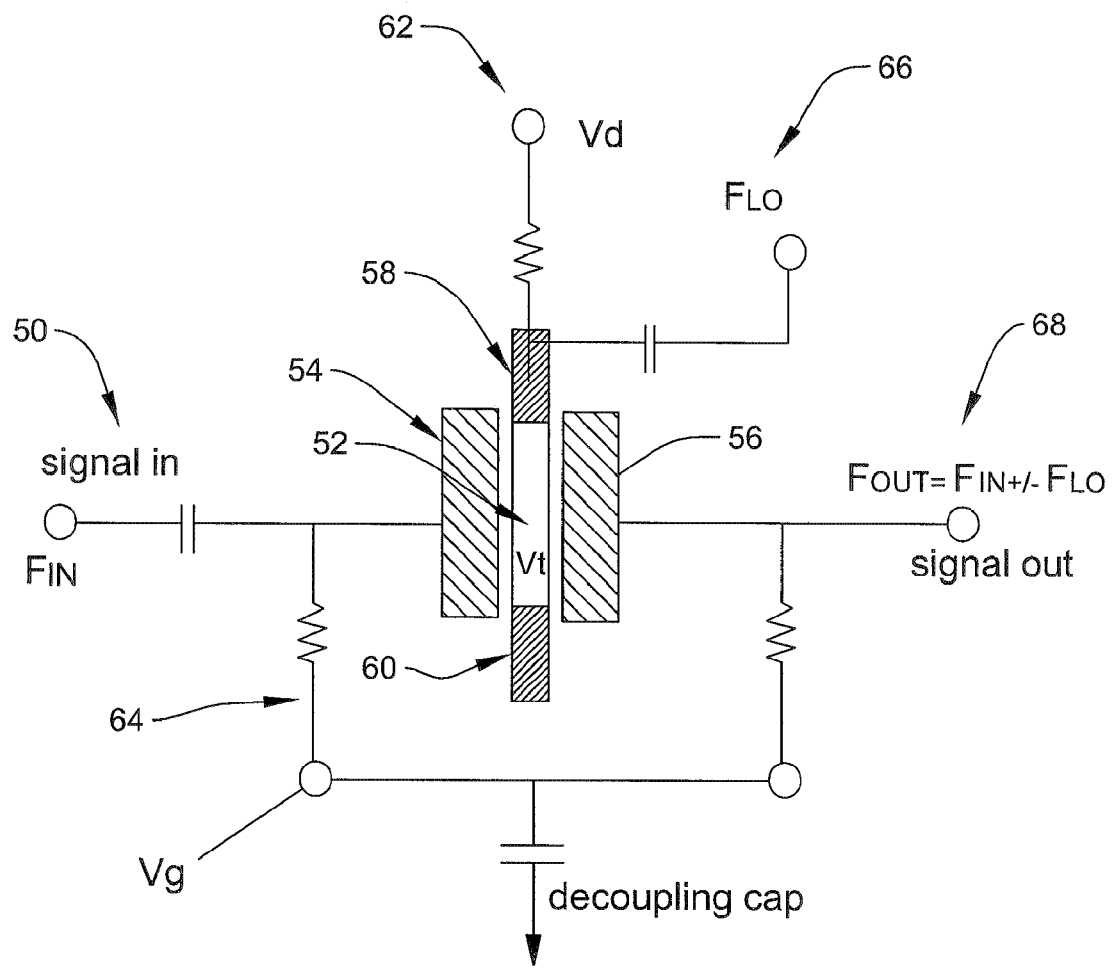
FIG. 3 is a schematic diagram of a transistor utilized as a radio frequency mixer and switch.

The FinFET embodiments are illustrated in FIGS. 1 and 3. These embodiments have a fin 12 that is formed on an insulating substrate 10. The fin 12 has a source region 20 at one end of the fin 12, a drain region 24 at an opposite end of the fin 12, and a channel region 22 in a center of the fin 12. The MOS embodiments shown in FIGS. 2 and 3 have a channel region 42 between source 32 and drain regions 34. Item 44 in FIG. 2 illustrates the bottom gate insulator. In both type of embodiments, the invention includes a first gate 14, 36 on a first side of the channel region 22, 42 and a second gate 16, 38 on a second side of the channel region 22, 42, opposite the first side. FIG. 2 most clearly illustrates the gate oxide 40 and, although it cannot be seen in the drawing, a similar gate oxide is included on each side of the channel region 22 in the structure in FIG. 1.

FIG. 3 illustrates both of the FinFET and the MOS devices schematically. In FIG. 3, the gates are labeled 54 and 56, the channel region, or body, is labeled 52, and the drain and source are labeled 58 and 60. The schematic drawing shown in FIG. 3 is intended to apply to all types of dual gate transistors, such as the FinFET and MOS transistors shown in FIGS. 1 and 2.

A common gate contact 64 is attached to the first and second gate 54, 56. A first signal input 50 is attached to the first gate 54 and a second signal input 66 is attached to either the source or drain region 58. Also, a voltage controlling source/drain contact 62 is connected to the source or drain region 58 where the second signal input 66 is attached. A signal output 68 is attached to the second gate 56.

Figure 4:
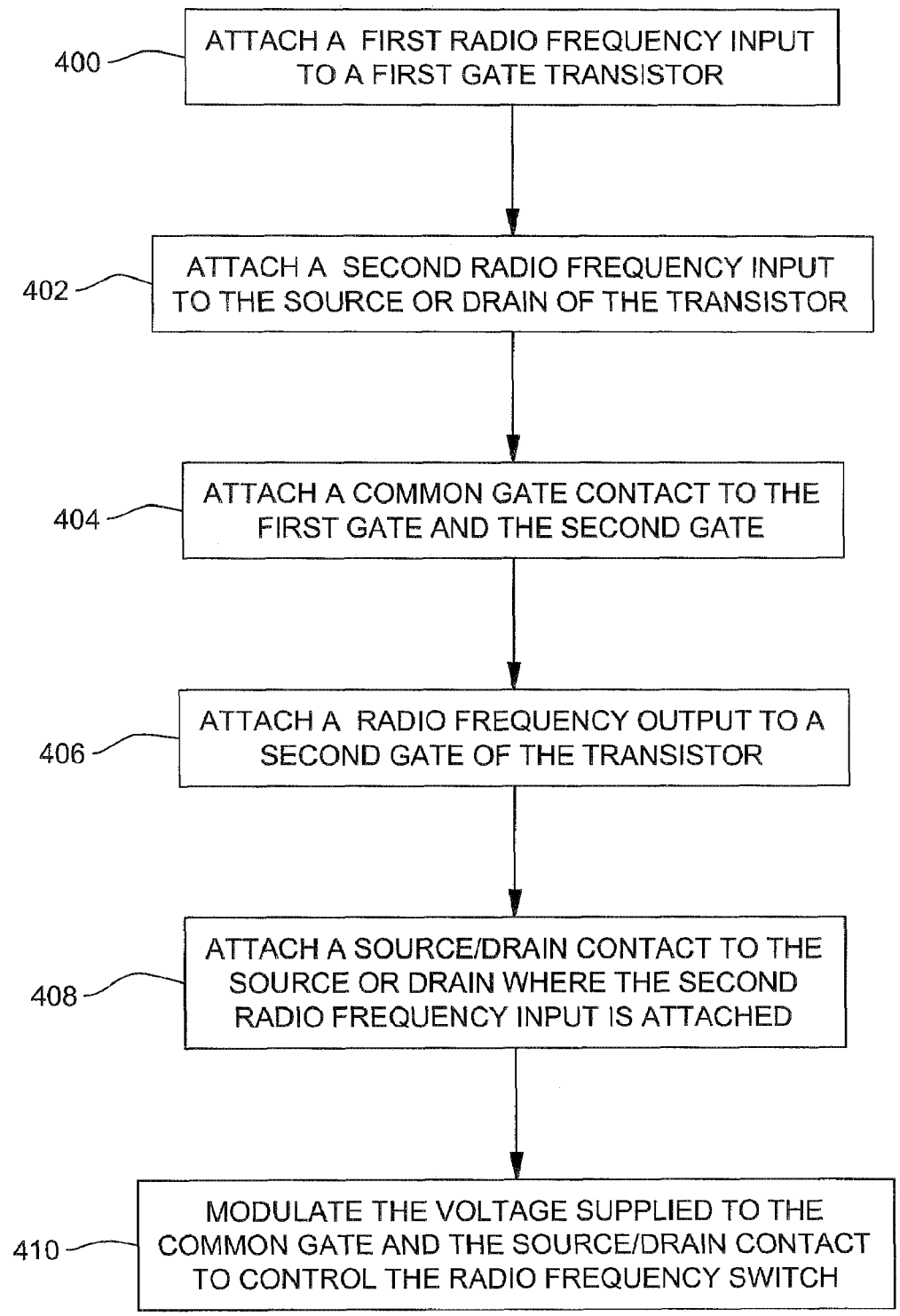
FIG. 4 is a flowchart illustrating a method embodiment.

A method embodiment of the invention modifies any dual gate transistor into a radio frequency switch. As shown in flowchart form in FIG. 4, the method attaches a first signal input to a first gate of the transistor 400, attaches a second signal input to the source or drain of the transistor 402, attaches a common gate contact to the first gate and the second gate 404, attaches a signal output to a second gate of the transistor 406, attaches a source/drain contact to the source or drain where the second signal input is attached 408, and modulates the voltage supplied to the common gate and the source/drain contact to control the radio frequency switch 410, as described below.

The channel region, or body, 52, is sufficiently thin and lightly doped so as to be fully depleted of majority carriers when the first and second gates at an electrical potential below the threshold voltage, measured with respect to the source and drain. Thus, the body behaves as an insulating dielectric when the gate voltages are less than a threshold voltage Vt of the channel region 52 added to the voltage Vd of the source/drain contact 62.

When the common gate contact 64 controls voltage Vg of the first gate 54 and the second gate 54 to be less than a threshold voltage Vt of the channel region 52 added to the voltage Vd of the source/drain contact 62, no inversion layers are formed, and the two gates are capacitively coupled to one another through the fully depleted semiconductor body, and the radio frequency switch is on. When Vg<Vd+ Vt the body is depleted of all free carriers and is effectively an insulator. Thus, a large capacitance is formed between the gates providing rf conduction.

When the common gate contact 64 controls voltage Vg of the first gate 54 and the second gate 54 to be greater than the threshold voltage Vt of the channel region 52 added to the voltage Vd of the source/drain contact 62, at least one inversion layer is present and electrically connected to the second signal input. The presence of the inversion carriers shields the signal output gate 56 from the first signal input gate 54. When Vg>Vd+Vt inversion layers form in the body, connected to the n+perimeter. If this n+perimeter is at fixed potential, any rf signal on one gate is greatly attenuated by the two inversion layer with a very small coupling present at the opposite gate. Hence the switch is off.

The thin semiconductor body is fully depleted when Vg<Vd+Vt, and is strongly inverted with electrons when Vg>Vd+Vt, with highly-doped n+regions in the perimeter of the body. This switch is bidirectional. Furthermore, modulating the source/drain when biased nearly by Vt below the gate voltage, will result in an rf mixer. When a radio frequency signal of a first frequency, $F_{IN}$, is applied to the first signal input, and a second radio frequency signal, of a second frequency, $F_{LO}$, is applied to the second signal input, the signal output will comprise a signal that is given approximately by the mathematical product of the first and second signal inputs, and will consist of series of secondary frequencies, $F_{OUT}$, given by $F_{OUT}=N \times F_{IN}+M \times F_{LO}$, where N and M are any integers. Typically, it is desirable to obtain either $F_{OUT}=F_{IN}+F_{LO}$ or $F_{OUT}=F_1-F_2$ for the purposes of signal processing, such as intermediate frequency processing, amplification, or detection, or for synthesizing a new frequency, and the desired sum or difference of $N \times F_{IN}$ and $M \times F_{LO}$ are selected from the resultant signal output by well-known techniques such as high-Q filters, or Digital Signal Processing.

When the radio frequency switch is off, the radio-frequency switch does not pass signals from the first signal input 50 to the signal output 68, and when the radio frequency switch is on, the radio frequency switch passes signals from the first signal input 50 to the signal output 68. When the second signal input is time-varying, e.g. a radio-frequency signal, the output signal will comprise the product of the first signal input and the second signal input, thereby 'mixing' the two signal inputs.

The signal output 68 produces a combined radio frequency signal ($F_{OUT}$) resulting from a combination of different radio frequency signals received by the first signal input 50 ($F_{IN}$) and the second signal input 66($F_{Lo}$), when the switch is on. This combination of radio frequency signals can be the first signal ($F_{IN}$) added to the second ($F_{LO}$) signal, or the second signal ($F_{LO}$) subtracted from the first signal ($F_{IN}$) depending upon the choice of filtering of the output signal ($F_{OUT}=F_{IN}+/-F_{OUT}$).

The invention provides a highly integrated radio-frequency switch for use in rf-CMOS technology and enables very low-cost implementation of transmitters, receivers and transceivers via monolithic fabrication. Operational speed is intrinsically well-matched to the speed of the transistors that result from the same, or similar Double-Gate/FinFET transistors. This further reduces costs through resultant high yields.

While the invention has been described in terms of preferred embodiments, those skilled in the art will recognize that the invention can be practiced with modification within the spirit and scope of the appended claims.

What is claimed is:

1. A method of modifying a dual gate transistor into a radio frequency switch, said method comprising:
   attaching a first radio frequency input to a first gate of said transistor;
   attaching a second radio frequency input to one of a source region and a drain region of said transistor;
   attaching a common gate contact to said first gate and said second gate;
   attaching a signal output to a second gate of said transistor;
   attaching a source/drain contact to one of said source region and said drain region where said second signal input is attached; and
   modulating the voltage supplied to said common gate and said source/drain contact to control said radio frequency switch.

2. The method according to claim 1, wherein said signal output produces a combined radio frequency signal resulting from a combination of different radio frequency signals received by said first signal input and said second signal input.

3. The method according to claim 1, wherein, during said modulating, when voltage in said first gate and said second gate is less than a threshold voltage of said channel region added to a voltage of said source/drain contact, said radio frequency switch is on.

4. The method according to claim 3, wherein, during said modulating, when said radio frequency switch is off, said radio frequency switch does not pass radio frequency signals from said first signal to said signal output.

5. The method according to claim 1, wherein, during said modulating, when voltage in said first gate and said second gate is greater than a threshold voltage of said channel region added to a voltage of said source/drain contact, said radio frequency switch is off.

6. The method according to claim 5, wherein, during said modulating, when said radio frequency switch is on, said radio frequency switch passes radio frequency signals from said first signal input to said signal output.

7. A radio frequency switch comprising:
   a fin having a source region at one end of said fin, a drain region at an opposite end of said fin, and a channel region in a center of said fin;
   a first gate on a first side of said channel region;
   a second gate on a second side of said channel region, opposite said first side;
   a common gate contact attached to said first gate and said second gate;
   a first signal input attached to said first gate;
   a second signal input attached to said one of said source region and said drain region;
   a source/drain contact connected to one of said source region and said drain region where said second signal input is attached; and
   a signal output attached to said second gate.

8. The radio frequency switch according to claim 7, wherein said signal output produces a combined radio frequency signal resulting from a combination of different radio frequency signals received by said first signal input and said second signal input.

9. The radio frequency switch according to claim 7, wherein when said common gate contact controls voltage of said first gate and said second gate to be less than a threshold voltage of said channel region added to a voltage of said source/drain contact, said radio frequency switch is on.

10. The radio frequency switch according to claim 7, wherein when said radio frequency switch is off, said radio frequency switch does not pass radio frequency signals from said first signal input to said signal output.

11. The radio frequency switch according to claim 7, wherein when said common gate contact controls voltage of said first gate and said second gate to be greater than a threshold voltage of said channel region added to a voltage of said source/drain contact, said radio frequency switch is off.

12. The radio frequency switch according to claim 7, wherein when said radio frequency switch is on, said radio frequency switch passes radio frequency signals from said first signal input to said signal output.

13. A radio frequency switch comprising:
   a fin having a source region at one end of said fin, a drain region at an opposite end of said fin, and a channel region in a center of said fin;
   a first gate on a first side of said channel region;
   a second gate on a second side of said channel region, opposite said first side;
   a first signal input attached to said first gate;
   a signal frequency input attached to said one of said source region and said drain region; and
   a signal output attached to said second gate.

14. The radio frequency switch according to claim 13, wherein said signal output produces a combined radio frequency signal resulting from a combination of different radio frequency signals received by said first signal input and said second signal input.

15. The radio frequency switch according to claim 13, further comprising a source/drain contact connected to one of said source region and said drain region where said second signal input is attached.

16. The radio frequency switch according to claim 15, wherein when voltage in said first gate and said second gate is less than a threshold voltage of said channel region added to a voltage of said source/drain contact, said radio frequency switch is on.

17. The radio frequency switch according to claim 16, wherein when said radio frequency switch is off, said radio frequency switch does not pass radio frequency signals from said first signal input said signal output.

18. The radio frequency switch according to claim 15, wherein when voltage in said first gate and said second gate is greater than a threshold voltage of said channel region added to a voltage of said source/drain contact, said radio frequency switch is off.

19. The radio frequency switch according to claim 18, wherein when said radio frequency switch is on, said radio frequency switch passes radio frequency signals from said first signal input to said signal output.

20. A radio frequency switch comprising:
   a fin having a source region at one end of said fin, a drain region at an opposite end of said fin, and a channel region in a center of said fin;
   a first gate on a first side of said channel region;
   a second gate on a second side of said channel region, opposite said first side;
   a common gate contact attached to said first gate and said second gate;
   a first signal input attached to said first gate;
   a second signal input attached to said one of said source region and said drain region; and
   a signal output attached to said second gate.

21. The radio frequency switch according to claim 20, wherein said signal output produces a combined radio frequency signal resulting from a combination of different radio frequency signals received by said first signal input and said second signal input.

22. The radio frequency switch according to claim 20, further comprising a source/drain contact connected to one of said source region and said drain region where said second signal input is attached.

23. The radio frequency switch according to claim 22, wherein when said common gate contact controls voltage of said first gate and said second gate to be less than a threshold voltage of said channel region added to a voltage of said source/drain contact, said radio frequency switch is on.

24. The radio frequency switch according to claim 23, wherein when said radio frequency switch is off, said radio frequency switch does not pass radio frequency signals from said first signal input to said signal output.

25. The radio frequency switch according to claim 22, wherein when said common gate contact controls voltage of said first gate and said second gate to be greater than a threshold voltage of said channel region added to a voltage of said source/drain contact, said radio frequency switch is off.

26. The radio frequency switch according to claim 25, wherein when said radio frequency switch is on, said radio frequency switch passes radio frequency signals from said first signal input to said radio frequency output.

27. A radio frequency switch comprising:
a metal oxide semiconductor transistor having a source region, a drain region, and a channel region;
a first gate on a first side of said channel region;
a second gate on a second side of said channel region, opposite said first side;
a first signal input attached to said first gate;
a second signal input attached to said one of said source region and said drain region; and
a signal output attached to said second gate.

28. The radio frequency switch according to claim 27, wherein said signal output produces a combined radio frequency signal resulting from a combination of different radio frequency signals received by said first signal input and said second signal input.

29. The radio frequency switch according to claim 27, further comprising a source/drain contact connected to one of said source region and said drain region where said second signal input is attached.

30. The radio frequency switch according to claim 29, wherein when voltage in said first gate and said second gate is less than a threshold voltage of said channel region added to a voltage of said source/drain contact, said radio frequency switch is on.

31. The radio frequency switch according to claim 30, wherein when said radio frequency switch is off, said radio frequency switch does not pass radio frequency signals from said first signal input to said signal output.

32. The radio frequency switch according to claim 29, wherein when voltage in said first gate and said second gate is greater than a threshold voltage of said channel region added to a voltage of said source/drain contact, said radio frequency switch is off.

33. The radio frequency switch according to claim 32, wherein when said radio frequency switch is on, said radio frequency switch passes radio frequency signals from said first signal input to said signal output.

* * * * *